US010128661B2

(12) United States Patent
Mayer et al.

(10) Patent No.: US 10,128,661 B2
(45) Date of Patent: Nov. 13, 2018

(54) STATUS INDICATOR FOR POWER GENERATION SYSTEMS

(71) Applicant: SolarCity Corporation, San Mateo, CA (US)

(72) Inventors: Alex Mayer, San Francisco, CA (US); Sandeep Narla, San Jose, CA (US)

(73) Assignee: SolarCity Corporation, San Mateo, CA (US)

( * ) Notice: Subject to any disclaimer, the term of this patent is extended or adjusted under 35 U.S.C. 154(b) by 118 days.

(21) Appl. No.: 15/089,431

(22) Filed: Apr. 1, 2016

(65) Prior Publication Data
US 2016/0308365 A1 Oct. 20, 2016

Related U.S. Application Data

(60) Provisional application No. 62/149,996, filed on Apr. 20, 2015.

(51) Int. Cl.
G06F 1/28 (2006.01)
H02J 3/38 (2006.01)
H02M 3/04 (2006.01)
H02M 7/44 (2006.01)
H02M 1/10 (2006.01)
G01R 19/165 (2006.01)
H02M 1/00 (2006.01)

(52) U.S. Cl.
CPC ........ *H02J 3/383* (2013.01); *G01R 19/16566* (2013.01); *H02M 1/10* (2013.01); *H02M 3/04* (2013.01); *H02M 7/44* (2013.01); *H02M 2001/0009* (2013.01); *Y02E 10/563* (2013.01)

(58) Field of Classification Search
None
See application file for complete search history.

(56) References Cited

U.S. PATENT DOCUMENTS

| 5,712,572 | A  | 1/1998  | Tamechika et al. |
| 7,333,916 | B2 | 2/2008  | Warfield et al.  |
| 8,319,470 | B2 | 11/2012 | English et al.   |
| 8,344,240 | B2 | 1/2013  | Bennett et al.   |
| 8,575,783 | B2 | 11/2013 | Jeong et al.     |

(Continued)

*Primary Examiner* — Joseph Feild
*Assistant Examiner* — John Mortell
(74) *Attorney, Agent, or Firm* — Kilpatrick Townsend & Stockton LLP

(57) ABSTRACT

An indicator device includes a housing configured to be coupled to positive and negative DC wire lines that supply power from an energy generation source to an inverter. The indicator device further includes a current sensor for measuring a current level on the positive and negative DC wire lines, and voltage sensors for measuring a first voltage across the positive and negative DC wire lines, a second voltage across the positive DC wire line and a ground terminal, and a third voltage across the negative DC wireline and the ground terminal. A circuit block compares the measured current level to one or more threshold current levels, and further compares the measured first, second and third voltages to one or more threshold voltage levels, and in response provides an output signal. A visual indicator receives the output signal from the circuit block, and in response provides a visual indication of whether voltage and current levels on the positive and negative DC wire lines are at levels that may harm humans.

17 Claims, 6 Drawing Sheets

(56) References Cited

U.S. PATENT DOCUMENTS

| | | |
|---|---|---|
| 8,837,097 B2 | 9/2014 | Zuercher et al. |
| 8,859,884 B2 | 10/2014 | Dunton et al. |
| 2009/0207543 A1 | 8/2009 | Boniface et al. |
| 2011/0301772 A1* | 12/2011 | Zuercher ................. H02H 7/20 700/293 |
| 2012/0049810 A1* | 3/2012 | Huang ..................... G05F 1/46 323/271 |
| 2012/0242321 A1 | 9/2012 | Kasai et al. |
| 2013/0106574 A1 | 5/2013 | Kyberd |
| 2013/0201027 A1 | 8/2013 | Bucher |
| 2014/0046534 A1* | 2/2014 | Lazar, II ................. B60L 3/04 701/33.9 |
| 2014/0266288 A1 | 9/2014 | Trabacchin et al. |
| 2015/0280642 A1 | 10/2015 | Chisenga |

* cited by examiner

STATUS INDICATOR FOR POWER GENERATION SYSTEMS

CROSS REFERENCE TO RELATED APPLICATIONS

This application claims the benefit of U.S. Provisional Application No. 62/149,996, filed Apr. 20, 2015, which is hereby incorporated by reference for all purposes.

BACKGROUND

Solar energy is becoming increasingly popular in America. Although residential solar penetration rates are still quite low, solar is one of the fastest growing industries in the United States. This has caught the attention of the National Fire Protection Association—publishers of the National Electric Code—and other state and municipal regulatory authorities.

One concern raised by the rapid proliferation of solar systems is safety. During daylight hours, solar systems generate power. As a result, there is high voltage DC (potentially up to 1000 volts) or AC (potentially up to 500 volts) on the cables running from the photovoltaic (PV) array to the inverter or other power equipment located a distance away that could shock a firefighter, line worker or other maintenance personnel if they were to come in contact with those cables (e.g., to sever them) when extinguishing a fire, removing tree limbs, or performing some other operation. Therefore, it would be desirable to provide a mechanism for removing the power on the high voltage cables, e.g., via the rapid shutdown sequence. However, even in cases where rapid shutdown circuitry is used, there is no way to know with certainty, particularly in the unstable and destructive environment of a fire, tree-collapse or other disasters, what the state of the high voltage cables is. Current National Electric Code requirements do not propose any way of indicating to workers or first responders the state of a PV system even after initiating a rapid shutdown sequence.

SUMMARY

According to various embodiments, an indicator device includes a housing configured to be coupled to positive and negative DC wire lines that supply power from an energy generation source to an inverter. The indicator device further includes at least one current sensor for measuring a current level on each of the positive and negative DC wire lines, and voltage sensors for measuring a first voltage across the positive and negative DC wire lines, a second voltage across the positive DC wire line and a ground terminal, and a third voltage across the negative DC wireline and the ground terminal. A circuit block compares the measured current level on each of the positive and negative DC wire lines to one or more threshold current levels, and further compares the measured first, second and third voltages to one or more threshold voltage levels, and in response provides an output signal. A visual indicator receives the output signal from the circuit block, and in response provides a visual indication of whether voltage and/or current levels on the positive and negative DC wire lines are at levels that harm humans.

In various embodiments, the output signal provided by the circuit block places the visual indicator in a first state if (a) the measured current level on each of the positive and negative DC wire lines is above a threshold current level, and/or (b) any of the measured first, second and third voltages is above a threshold voltage level, the first state being indicative of voltage and/or current levels on the positive and negative DC wire lines that harm humans.

In various embodiments, a power supply block supplies power to the circuit block and to the visual indicator, wherein the power supply block is powered by the positive and negative DC wire lines.

In various embodiments, the voltage sensors include a first voltage sensor. The first voltage sensor includes a first plurality of resistors serially connected between the positive DC wire line and a first input of the circuit block, and a second plurality of resistors serially connected between the negative DC wire line and a second input of the circuit block. The first and second inputs of the circuit block are coupled to a differential amplifier for detecting and amplifying a voltage across the first and second inputs.

In various embodiments, the energy generation source includes a photovoltaic array, and in various other embodiments, the energy generation source includes a battery pack or a AC voltage between lines (L-N/L-L).

DETAILED DESCRIPTION OF THE INVENTION

The following description is intended to convey a thorough understanding of the embodiments described by providing a number of specific embodiments. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

Figure 1:
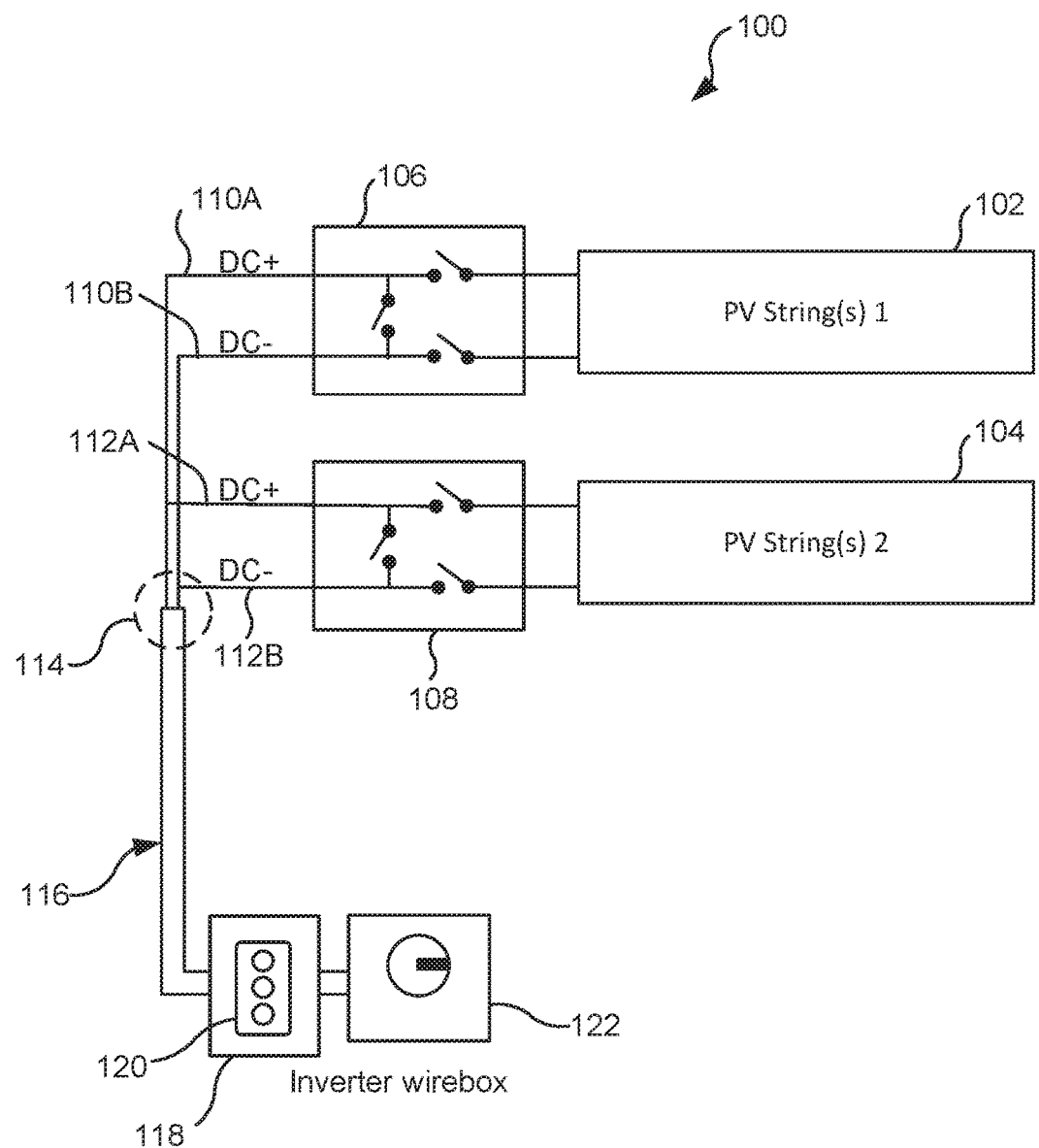
FIG. 1 illustrates components of a string inverter-based photovoltaic system including a status indicator according to various embodiments.

Referring now to FIG. 1, photovoltaic energy system 100 includes a pair of photovoltaic panel strings 102 and 104 each comprising two or more photovoltaic modules connected in a conventional series configuration (i.e., end-to-end). The PV strings may comprise a photovoltaic array of panels, such as a roof-top based array on the roof of a residence, business or other structure. It should be appreciated that in various embodiments, the PV modules could have DC optimizers on each of their outputs instead of performing string-level MPPT at the inverter. In still further embodiments, each module could have a micro-inverter or a mini-inverter (N to 1) outputting AC power. Such an embodiment is illustrated, for example, in FIG. 5 described further below.

In the exemplary photovoltaic energy system 100, the combined output of each PV string 102 and 104 is fed into respective rapid shutdown circuits 106 and 108, which may comprise separate boxes or enclosures located at or near the end of each PV string 102 and 104, or a single combined rapid shutdown device that has multiple inputs with single or multiple outputs. As described in commonly assigned U.S. patent application Ser. No. 14/681,705, these rapid shutdown circuits 106 and 108 may provide a mechanism for selectively shutting down the output of each PV string 102 and 104 or the combined outputs of the PV array. In some cases, the voltage on each PV string 102 and 104 will be DC and at 600 volts or less, representing the combined voltage of each photovoltaic panel in the string. In some cases, a DC optimizer may be used on the output of each photovoltaic panel in the string so that maximum power point tracking can be performed at the panel level rather than at the string level. The various embodiments of the invention may be implemented with or without panel-level DC optimizers and with or without panel-level or N-to-1 panel-level micro-inverters.

As illustrated in the exemplary embodiment shown in FIG. 1, each rapid shut down circuit 106 and 108 has respective pair of DC+ outputs 110A, 110B and DC− outputs 112A, 112B which, in various embodiments, maybe consolidated into a single positive line and a single negative line, such as, for example in a combiner box located generally at point 114 before the wires pass into protective conduit 116. This may be accomplished with a plug or by simply splicing the wires together with wire nuts or other known splicing mechanism.

The DC output originating from PV strings 102 and 104 couple to indicator device 118 which comprises one or more visual indicators 120, such as LEDs, that indicate the current status of the wires that carry power generated by PV strings 102 and 104. Indicator device 118 may receive the combined high voltage DC output of PV strings 102 and 104 at its input and be connected directly to the inputs of inverter wirebox 122 at its output. In some embodiments, indicator device 118 may have a separately mounted chassis that is mounted on the side of the structure near inverter wirebox 122. In other embodiments, indicator device 118 may be attached directly to the side of inverter wirebox 122 as a collar or other structure that mechanically couples to the existing wire terminals on the input side of inverter wirebox 122 to simplify installation and so that indicator device 118 would work with a variety of different third-party string inverters and without modifications thereto.

Figure 2:
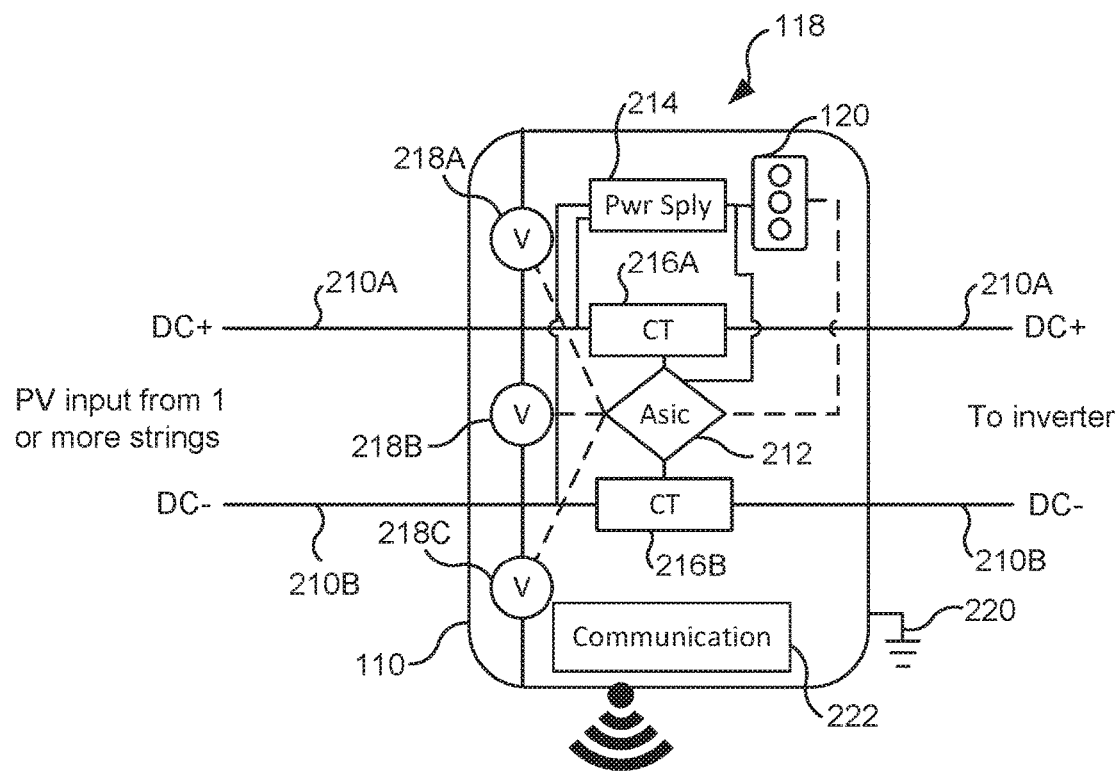
FIG. 2 is a block diagram illustrating the internal components of an exemplary status indicator device according to various embodiments.

Referring to FIG. 2, a block diagram illustrating the internal components of an exemplary status indicator device 118 according to various embodiments is shown. Indicator device 118 includes a main chassis or enclosure 110 that houses the internal components and connectors. For example, positive and negative high voltage DC lines DC+ 210A and DC− 210B enter indicator device 118 on the input side and these same lines exit indicator device 118 on the output side, supplying the positive and negative high voltage DC lines DC+ 210A and DC− 210B to the inverter that is housed inside inverter wirebox 122 (FIG. 1). Chassis 110 may include a set of standard photovoltaic connectors (e.g., MC4, Amphenol H4, etc.) on one or both of the input and output sides, or may simply comprise mechanical wire connectors such as wire lugs, spring loaded connectors or other types of known connectors.

Indicator device 118 may include panel of LEDs 120 having three LEDs in different colors, e.g., red, yellow and green, each corresponding to a different state of wire lines 210A and 210B. In various embodiments, panel 120 may only include a single LED, or a tri-color uni-LED to indicate whether or not wire lines 210A and 210B carry high voltage and/or high current. In other embodiments, different color LEDs may be used to indicate different states of wire lines 210A and 210B (e.g., red indicates high voltage/high current, green indicates no voltage or current, and yellow indicates some other state, such as there is some voltage and and/or some current but not high enough to be harmful to humans). In other embodiments, a liquid crystal display or other type of visual indicator may be used to communicate the state of wire lines 210A and 210B.

In various embodiments, indicator device 118 includes circuit block 212, such as, an application specific integrated circuit (ASIC), that may include a digital signal processor (DSP) or microcontroller storing program code to enable it to, based on the level of current and voltage measured on high voltage DC lines 210A and 210B, control LED panel 120 to illuminate the appropriate LED. In various embodiments, power supply circuit 214 may power panel 120 and ASIC 212. Power supply circuit 214 receives and coverts the power on DC+ 210A and DC− 210B to lower voltages suitable for powering panel 120 and ASIC 212. During operation, ASIC 212 may send one or more signals to panel 120 informing it of which LED to illuminate. In other embodiments, ASIC 212 may control a relay or other device in power supply 214 to illuminate the correct LED in panel 120. Other control schemes are possible without departing from the spirit or scope of the invention.

Figure 3:
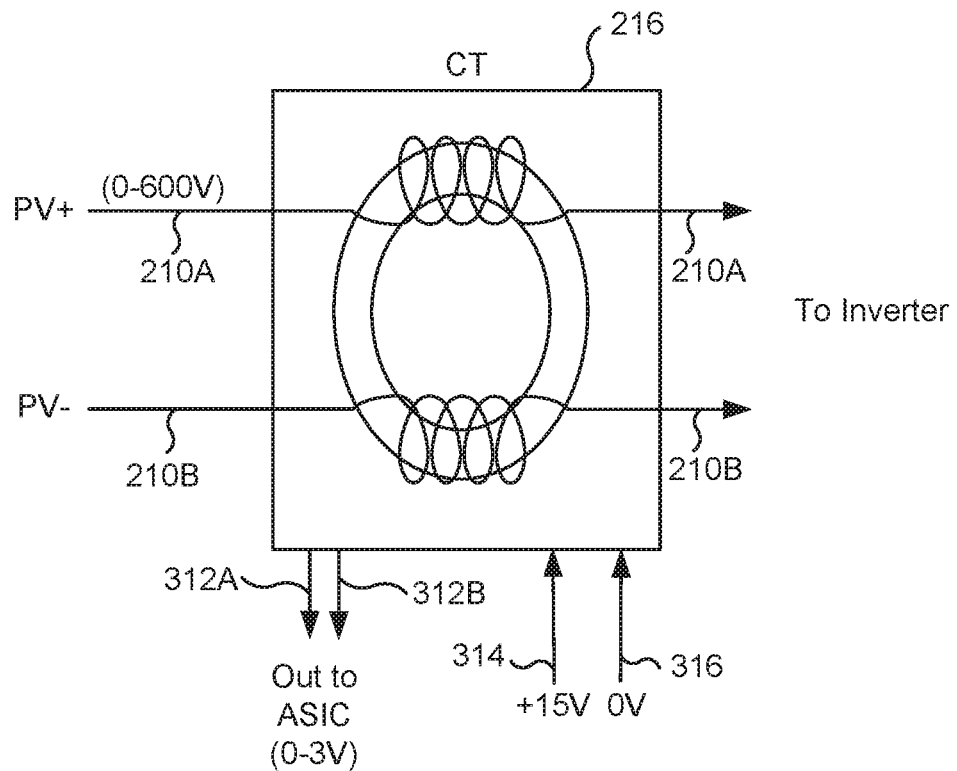
FIG. 3 is a block diagram illustrating a transformer-based current sensor according to various embodiments.

Accurate operation of indicator panel 120 is dependent on correctly measuring both the current and voltage on high voltage DC lines 210A and 210B so that the state of wire lines 210A and 210B can be ascertained in real time. In various embodiments, this may be accomplished using pair of current sensors 216A and 216B and three voltage sensors 218A, 218B and 218C. Current sensors 216A and 216B may be implemented using a transformer coupled to DC input lines 210A and 210B, and outputting a signal reflecting the measured current to ASIC 212, as illustrated in FIG. 3. Current sensors 216A, 216B may alternatively include one or more Hall effect sensors, shunt current sensors, or other methods of accurately measuring current. In FIG. 3, current sensor 216 is powered by a supply voltage provided on lines 314 and 316. In this exemplary embodiment, current sensor 216 is powered by a +15V power supply, though other supply voltages may be used depending on the implementation of current sensor 216. Current sensor 216 measures the current on each of wire lines 210A and 201B and respectively outputs signals on outputs 312A and 312B, indicative of the measured currents. The signals provided on outputs 312A and 312B are routed to ASIC 212, and thus need to be within the operating voltage range of the ASIC. In some embodiments, ASIC 212 operates based on a 3V supply. ASIC 212 digitizes the signals received from current sensor 216 and compares the digitized signals to one or more threshold levels as described further below.

Figure 4:
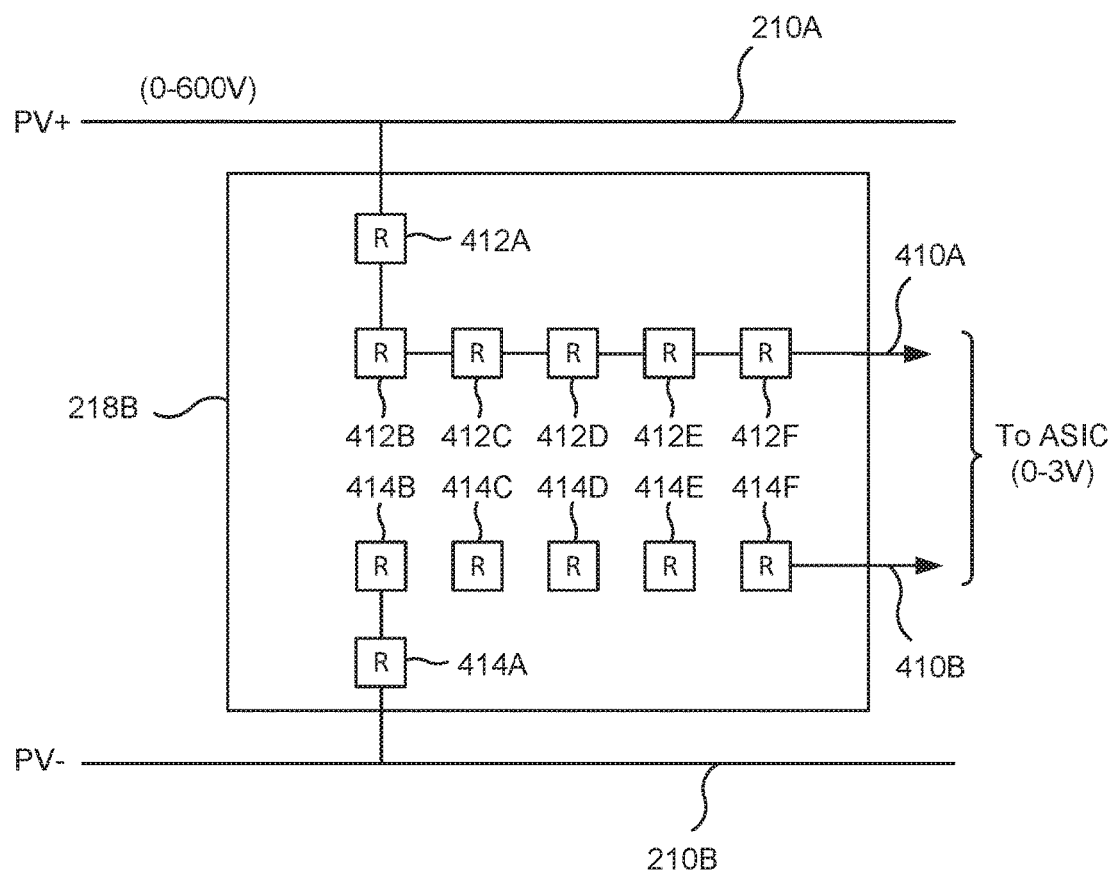
FIG. 4 is a block diagram illustrating a voltage sensor according to various embodiments.

Voltage sensors 218A, 218B and 218C are coupled to measure the voltage across DC+ line 210A and the ground potential, DC+ line 210A and DC− line 210B, and DC− line 210B and the ground potential, respectively. Each of voltage sensors 218A, 218B and 218C may be implemented using an appropriate network of resistors. FIG. 4 shows an exemplary implementation of voltage sensor 218B. The other voltage sensors 218A and 218C may be implemented using a similar circuit. In FIG. 4, voltage sensor 218B includes a network of resistors connected between DC lines 210A, 210B and ASIC 212. In various embodiments, the network of resistors includes first group of resistors 412A-412F serially connected between DC+ line 201A and ASIC 212, and second group of resistors 414A-414F serially connected between DC− line 210B and ASIC 212. Each of the resistors in the resistor network may have a value in the range of 1 MΩ to 50 MΩ depending on the number of resistors in the network, the voltage range on DC+ and DC− lines during operation, the required voltage levels on terminals 410A and 410B that are supplied to ASIC 212, among other factors. An advantage of serially connecting a greater number of resistors is that in the event one or more of the serially connected resistors fail, the remaining resistors will provide sufficient impedance to protect ASIC 212. In some embodiments, output terminals 410A and 410B of voltage sensor 218B may be provided to a sense amplifier in ASIC 212 that can detect the voltage difference between terminals 410A and 410B. The signal provided on output terminals 410A and 410B of voltage sensor 218B is routed to ASIC 212, and thus needs to be within the operating voltage range of the ASIC, e.g., 0-3V.

Voltage sensor 218A may include a similar network of resistors connected between DC+ line 210A and ASIC 212, and between the ground potential and ASIC 212 for sensing the voltage difference between DC+ line 210A and the ground. Similarly, voltage sensor 218C may include a network of resistors connected between DC− line 210B and ASIC 212, and between the ground potential and ASIC 212 for sensing the voltage difference between DC− line 210B and the ground. ASIC 212 compares the sensed voltages against one or more threshold voltage values, and also compares the digitized values corresponding to the measurements made by current sensors 216A, 216B against threshold current values in order to determine the voltage and current levels on lines 210A, 210B. Depending on the measured values relative to the threshold values, ASIC 212 causes an appropriate LED in LED panel 120 to be illuminated. In this manner, a fireman, first responder or maintenance personnel will know the present state of wire lines 210A, 210B. As an example, if a shutdown command is issued to engage shutdown devices 106, 108 (FIG. 1) in order to stop the flow of current from PV strings 102 and 104, LED panel 120 will provide visual feedback indicating whether in fact, the flow of current out of the PV strings has stopped.

In various embodiments, the stored threshold values may correspond to levels set by code to indicate safe levels of current and voltage. For example, in some embodiments: (1) if all the measured current and voltage values are below a first set of current and voltage threshold levels, ASIC 212 would cause a green LED to be illuminated indicating that the voltage and current levels on the DC wire lines are low enough to not pose any danger to humans; (2) if all the measured current and voltage values are below a second set of current and voltage threshold levels higher than the first set, and if any of the measured current and voltage values is above the first set of current and voltage threshold levels, ASIC 212 would cause a yellow LED to be illuminated indicating that the voltage and current levels on the DC wire lines are high enough that caution should be exercised; and (3) if any of the measured current and voltage levels is above the second set of current and voltage threshold levels, ASIC 212 would cause a red LED to be illuminated indicating that the voltage and/or current levels are high enough to cause harm to humans. In an exemplary embodiment, the second set of current and voltage threshold levels are 30V and 8 A, respectively, so that when any of the measured voltages is above 30V or any of the measure currents is above 8 A, the red LED is illuminated. The particular LED colors that are associated with various current/voltage levels are not critical. Labeling can be used to associate any of the LEDs with any condition so long as the labeling is consistent with the threshold values. In another embodiment, the threshold levels are set according to NEC 2014 rapid shutdown requirement levels.

Alternatively, a different scheme than comparison to sets of threshold values may be used. For example, where a single LED is used, a detected current and/or voltage above zero or some nominal value would cause the LED to be illuminated indicating the presence of current and/or voltage on the DC+ and DC− lines, and the absence of current and voltage would result in no LEDs being illuminated, indicating safe conditions for humans. Many other combinations may be implemented without departing from the spirit or scope of the invention.

Referring back to FIG. 2, indicator device 118 also includes an integrated communication module 222. In various embodiments, communication module 222 may send out an encoded or modulated wireless or wireline signal containing information indicative of the current status of the DC+ and DC− lines 210A, 210B. Communication module 222 may comprise a wireless transceiver based on Wi-Fi, ZigBee, Bluetooth, PLC (power-line communications) or some other suitable wireless or wireline data communication protocol. Alternatively, communication module 222 may impart a signal on one or more of the high voltage DC lines 210A, 210B to communicate with the inverter or other structure using power-line communications.

In various embodiments, it may be desirable to include a grounding lug or other terminal 220 to enable the enclosure to be grounded relative to the high voltage DC potential passing through indicator device 118 depending on the specific material making up the chassis 110. For example, if chassis 110 is made of an electric conductor it will be necessary to separately ground it. Otherwise, if it is made of plastic, polymer, or other non-conductive material, grounding will not be necessary.

Figure 5:
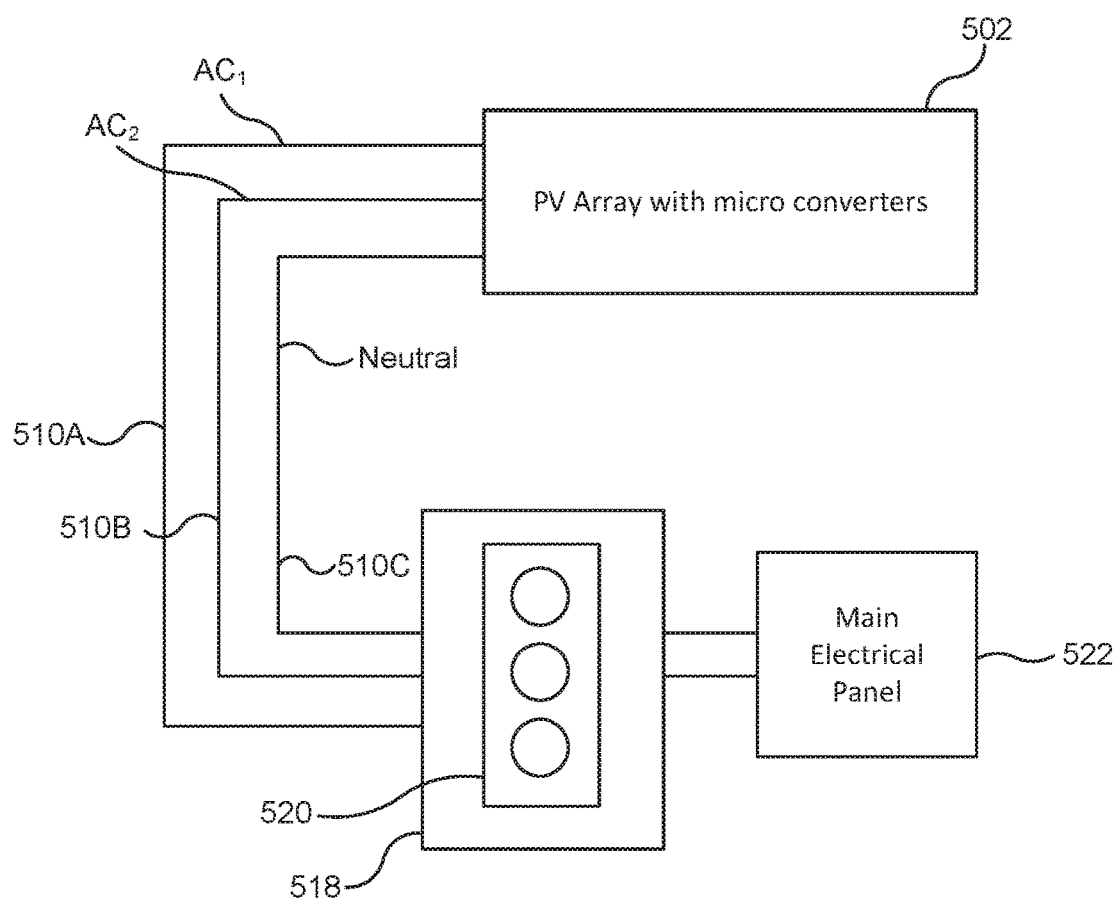
FIG. 5 illustrates components of a micro inverter-based photovoltaic system including a status indicator according to various embodiments.

Various embodiments disclosed herein may also be used with an alternating current (AC) photovoltaic system, such as that illustrated in FIG. 5. In this system, photovoltaic array 502 may include an array of two or more panels where each panel, or a subset of panels (e.g., 2, 3, 4, etc.) feed their DC output into a micro inverter that inverts the DC output into AC. The AC output is then combined into AC bus lines or, alternatively, each micro inverter's output is connected to an AC input of the next micro inverter, thereby daisy chaining them together end-to-end without needing separate AC bus lines. Typically, as shown in FIG. 5, there will be three wire lines running from array 502 to the customer's main electrical panel 522, including AC phase 1 wire line 510A, AC phase 2 wire line 510B, and a neutral wire line 510C.

As shown in FIG. 5, in various embodiments, indicator device 518 may be positioned between PV array 502 and main electrical panel 522, with AC phases 1 and 2 and the neutral wire lines connected to the inputs and flowing through indicator device 518 to the output side for connection to main electrical panel 522. In various embodiments, indicator device 518 may measure the voltages and current across the three wire lines coming from PV array 502. As with device indicator 118 in FIG. 1, device indicator 518 may comprise a single LED, a multi-color LED, a plurality of LEDs of different colors, or even a display screen such as an LCD that is used by indicator device 518 to provide a visual indication of the current status of the AC lines 510A, 510B and neutral line 510C. In DC PV systems, such as that in FIG. 1, the voltage and current are uni-polar so a uni-polar current transformer is used. However, for AC PV systems, such as that in FIG. 5, the voltage and current are bi-polar so a bi-polar current transformer is needed, and the current transformer may be powered by −15V and 15V power supplies. It is noted that 15V and −15V are merely exemplary, and other supply voltages such as 3V, 5V, 10V, 12V, 18V and 24V may be used instead.

Figure 6:
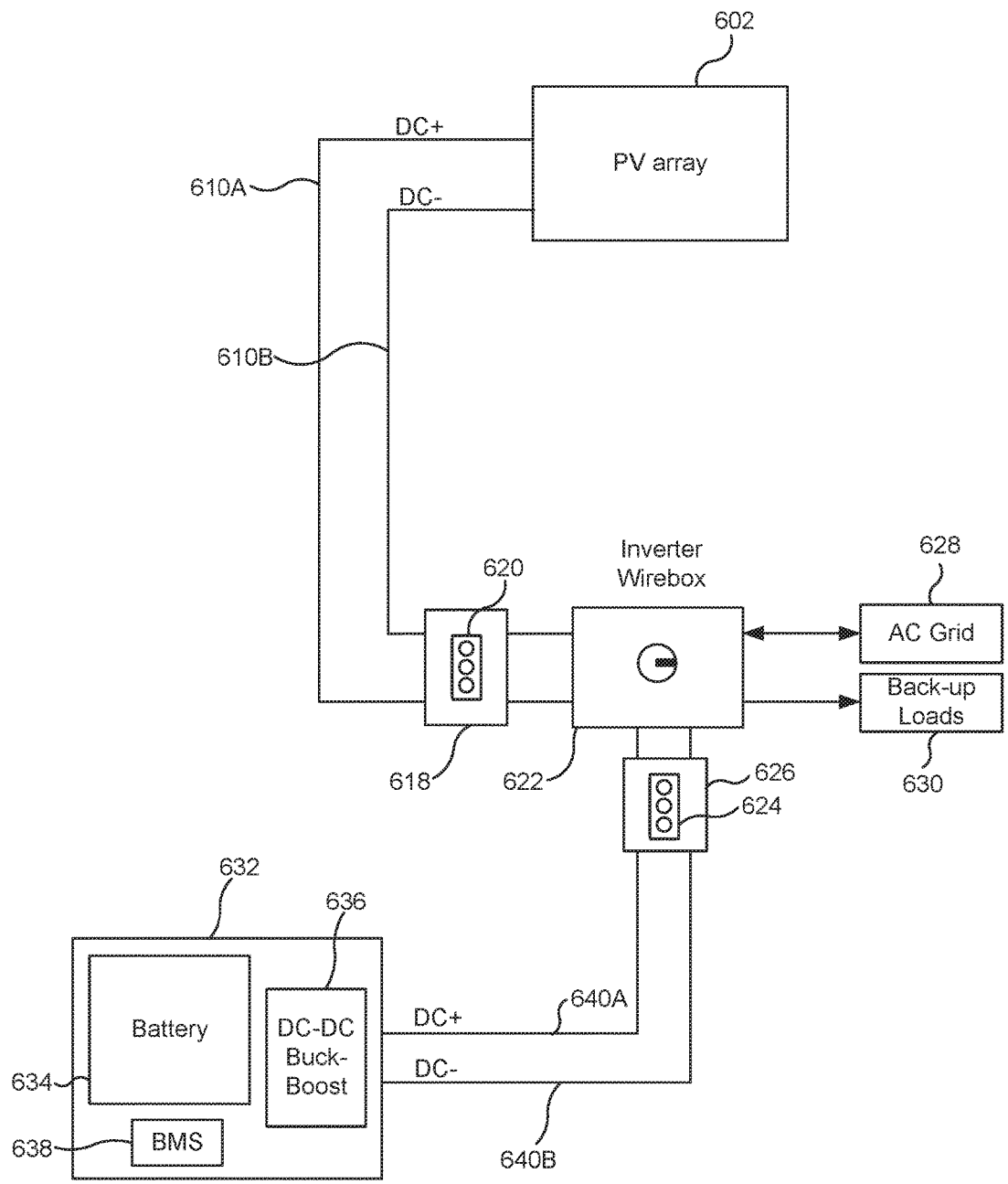
FIG. 6 illustrates components of a power generation system including a PV array and a battery pack each equipped with a status indicator according to various embodiments.

The embodiments of the status indicator disclosed herein may also be implemented in hybrid PV and battery power generation systems, such as that described in commonly assigned patent application Ser. No. 14/798,069, which is hereby incorporated by reference in its entirety. FIG. 6 shows an exemplary embodiment of such system. PV array 602, DC wirelines 610A, 610B on which PV array 602 supplies the generated power, indicator device 618 are similar to those in FIGS. 1-4 of the instant application and thus will not be described. Battery pack 632 is shown being coupled to inverter wirebox 622 via DC+ and DC− wire lines 640A and 640B through indicator device 626. Battery pack 632 includes one or more conventional battery modules 634, conventional battery management systems 638, and conventional DC-DC buck-boost converter 636. Indicator device 618 operates similarly to that in FIG. 1 to illuminate an appropriate LED in LED panel 624 based on the measured current and voltages on DC wire lines 640A, 640B. While the battery voltage is uni-polar, the battery current may be positive or negative depending on the direction of current flow (charging or discharging). Accordingly, a bi-polar current transformer is needed for current measurement.

The embodiments described herein are not to be limited in scope by the specific embodiments described above. For example, while the visual indicator is shown in the various figures to be located near the inverter wirebox or the main electrical panel, it can also be located close to the PV array and/or to the battery. Indeed, various modifications of the embodiments, in addition to those described herein, will be apparent to those of ordinary skill in the art from the foregoing description and accompanying drawings. Further, although some of the embodiments have been described herein in the context of a particular implementation in a particular environment for a particular purpose, those of ordinary skill in the art will recognize that their usefulness is not limited thereto and that they can be beneficially implemented in any number of environments for any number of purposes. Accordingly, the disclosure should be construed in view of the full breath and spirit of the embodiments as disclosed herein.

What is claimed is:

1. An indicator device, comprising:
   a housing configured to be coupled to positive and negative DC wire lines that supply power from an energy generation source to an inverter;
   at least one current sensor for measuring a current level on each of the positive and negative DC wire lines;
   a plurality of voltage sensors comprising:
      a first voltage sensor for measuring a first voltage across the positive and negative DC wire lines,
      a second voltage sensor for measuring a second voltage across the positive DC wire line and a ground terminal, and
      a third voltage sensor for measuring a third voltage across the negative DC wireline and the ground terminal;
   a circuit block configured to compare the measured current level on each of the positive and negative DC wire lines to one or more threshold current levels, and to compare the measured first, second and third voltages to one or more threshold voltage levels, and in response provide an output signal; and
   a visual indicator coupled to receive the output signal from the circuit block, and in response provide a visual indication of whether voltage or current levels on the positive and negative DC wire lines are above or below predetermined threshold levels, the visual indicator configured to be in:
      a first illuminated state if (a) the measured current level on either of the positive and negative DC wire lines is above a threshold current level, or (b) any of the measured first, second and third voltages is above a threshold voltage level;
      a second illuminated state if (a) the measured current level on either of the positive and negative DC wire lines is zero amps indicating that there is no current, or (b) any of the measured first, second and third voltages is zero volts indicating that there is no voltage; and
      a third illuminated state if (a) the measured current level on either of the positive and negative DC wire lines is between zero amps and the threshold current level, or (b) any of the measured first, second and third voltages is between zero volts and the threshold voltage level.

2. The indicator device of claim 1 wherein, the output signal provided by the circuit block places the visual indicator in the first illuminated state, the first state being indicative of voltage or current levels on the positive and negative DC wire lines that may harm humans.

3. The indicator device of claim 1 further comprising a power supply block for supplying power to the circuit block and to the visual indicator, wherein the power supply block is powered by the positive and negative DC wire lines.

4. The indicator device of claim 1 wherein the first voltage sensor includes a first plurality of resistors serially connected between the positive DC wire line and a first input of the circuit block, and a second plurality of resistors serially connected between the negative DC wire line and a second input of the circuit block, the first and second inputs of the circuit block being coupled to a differential amplifier for detecting and amplifying a voltage across the first and second inputs.

5. The indicator device of claim 1 wherein the energy generation source includes a photovoltaic array.

6. The indicator device of claim 1 wherein the energy generation source includes a battery pack.

7. A method of providing visual indication of a state of an energy generation source, the method comprising:
   detecting a current level on each of positive and negative DC wire lines configured to supply power generated by the energy generation source to an inverter;
   detecting a first voltage by a first voltage sensor across the positive and negative DC wire lines, a second voltage by a second voltage sensor across the positive DC wire line and a ground terminal, and a third voltage by a third voltage sensor across the negative DC wire line and ground potential;
   comparing the detected current level on each of positive and negative DC wire lines to a threshold current level, and the detected first, second and third voltages to a threshold voltage level, and if the detected current level on either of positive and negative DC wire lines is greater than the threshold current level; and providing, by a visual indicator:
- a first visual indication if (a) the measured current level on either of the positive and negative DC wire lines is above a threshold current level, or (b) any of the measured first, second and third voltages is above a threshold voltage level;
- a second illuminated state if (a) the measured current level on either of the positive and negative DC wire lines is zero amps indicating that there is no current, or (b) any of the measured first, second and third voltages is zero volts indicating that there is no voltage; and
- a third illuminated state if (a) the measured current level on either of the positive and negative DC wire lines is between zero amps and the threshold current level, or (b) any of the measured first, second and third voltages is between zero volts and the threshold voltage level.

8. The method of claim 7 wherein the energy generation source includes a photovoltaic array.

9. The method of claim 7 wherein the energy generation source includes a battery pack.

10. An energy generation system, comprising:
- a photovoltaic array configured to generate power on positive and negative DC wire lines coupled to an inverter;
- at least one current sensor for measuring a current level on each of the positive and negative DC wire lines;
- voltage sensors comprising:
  - a first voltage sensor for measuring a first voltage across the positive and negative DC wire lines,
  - a second voltage sensor for measuring a second voltage across the positive DC wire line and a ground terminal, and
  - a third voltage sensor for measuring a third voltage across the negative DC wireline and the ground terminal;
- a circuit block configured to compare the measured current level on each of the positive and negative DC wire lines to one or more threshold current levels, and to compare the measured first, second and third voltages to one or more threshold voltage levels, and in response provide an output signal; and
- a visual indicator coupled to receive the output signal from the circuit block, the visual indicator configured to be in:
  - a first illuminated state if (a) the measured current level on either of the positive and negative DC wire lines is above a threshold current level, or (b) any of the measured first, second and third voltages is above a threshold voltage level;
  - a second illuminated state if (a) the measured current level on either of the positive and negative DC wire lines is zero amps indicating that there is no current, or (b) any of the measured first, second and third voltages is zero volts indicating that there is no voltage; and
  - a third illuminated state if (a) the measured current level on either of the positive and negative DC wire lines is between zero amps and the threshold current level, or (b) any of the measured first, second and third voltages is between zero volts and the threshold voltage level.

11. The energy generation system of claim 10 wherein, the output signal provided by the circuit block places the visual indicator in a first state if (a) the measured current level on either of the positive and negative DC wire lines is above a threshold current level, or (b) any of the measured first, second and third voltages is above a threshold voltage level, the first state being indicative of voltage or current levels on the positive and negative DC wire lines that harm humans.

12. The energy generation system of claim 10 further comprising a power supply block for supplying power to the circuit block and to the visual indicator, wherein the power supply block is powered by the positive and negative DC wire lines.

13. The energy generation system of claim 10 wherein the first voltage sensor includes a first plurality of resistors serially connected between the positive DC wire line and a first input of the circuit block, and a second plurality of resistors serially connected between the negative DC wire line and a second input of the circuit block, the first and second inputs of the circuit block being coupled to a differential amplifier for detecting and amplifying a voltage across the first and second inputs.

14. A power generation system, comprising:
- a battery pack configured to generate power on positive and negative DC wire lines coupled to an inverter;
- at least one current sensor for measuring a current level on each of the positive and negative DC wire lines;
- a plurality of voltage sensors comprising:
  - a first voltage sensor for measuring a first voltage across the positive and negative DC wire lines,
  - a second voltage sensor for measuring a second voltage across the positive DC wire line and a ground terminal, and
  - a third voltage sensor for measuring a third voltage across the negative DC wireline and the ground terminal;
- a circuit block configured to compare the measured current level on each of the positive and negative DC wire lines to one or more threshold current levels, and to compare the measured first, second and third voltages to one or more threshold voltage levels, and in response provide an output signal; and
- a visual indicator coupled to receive the output signal from the circuit block, the visual indicator configured to be in:
  - a first illuminated state if (a) the measured current level on either of the positive and negative DC wire lines is above a threshold current level, or (b) any of the measured first, second and third voltages is above a threshold voltage level;
  - a second illuminated state if (a) the measured current level on either of the positive and negative DC wire lines is zero amps indicating that there is no current, or (b) any of the measured first, second and third voltages is zero volts indicating that there is no voltage; and
  - a third illuminated state if (a) the measured current level on either of the positive and negative DC wire lines is between zero amps and the threshold current level, or (b) any of the measured first, second and third voltages is between zero volts and the threshold voltage level.

15. The power generation system of claim 14 wherein, the output signal provided by the circuit block places the visual indicator in a first state if (a) the measured current level on either of the positive and negative DC wire lines is above a threshold current level, or (b) any of the measured first, second and third voltages is above a threshold voltage level, the first state being indicative of voltage or current levels on the positive and negative DC wire lines that harm humans.

16. The power generation system of claim 14 further comprising a power supply block for supplying power to the circuit block and to the visual indicator, wherein the power supply block is powered by the positive and negative DC wire lines.

17. The power generation system of claim 14 wherein the first voltage sensor includes a first plurality of resistors serially connected between the positive DC wire line and a first input of the circuit block, and a second plurality of resistors serially connected between the negative DC wire line and a second input of the circuit block, the first and second inputs of the circuit block being coupled to a differential amplifier for detecting and amplifying a voltage across the first and second inputs.

* * * * *